(12) United States Patent
Kurata et al.

(10) Patent No.: US 11,303,189 B2
(45) Date of Patent: Apr. 12, 2022

(54) MOTOR UNIT EQUIPPED WITH DECELERATOR

(71) Applicant: MABUCHI MOTOR CO., LTD., Chiba (JP)

(72) Inventors: Junya Kurata, Chiba (JP); Satoshi Kikuchi, Chiba (JP); Yoshihiro Hanazawa, Chiba (JP)

(73) Assignee: MABUCHI MOTOR CO., LTD., Chiba (JP)

(*) Notice: Subject to any disclaimer, the term of this patent is extended or adjusted under 35 U.S.C. 154(b) by 201 days.

(21) Appl. No.: 16/624,905

(22) PCT Filed: Jul. 31, 2018

(86) PCT No.: PCT/JP2018/028570
§ 371 (c)(1),
(2) Date: Dec. 19, 2019

(87) PCT Pub. No.: WO2019/026877
PCT Pub. Date: Feb. 7, 2019

(65) Prior Publication Data
US 2021/0344260 A1     Nov. 4, 2021

(30) Foreign Application Priority Data

Aug. 1, 2017     (JP) ................ JP2017-149348

(51) Int. Cl.
*H02K 5/22*     (2006.01)
*H02K 11/38*    (2016.01)
(Continued)

(52) U.S. Cl.
CPC ............ *H02K 11/38* (2016.01); *H02K 5/225* (2013.01); *H02K 7/1166* (2013.01); *H05K 1/18* (2013.01); *H02K 11/21* (2016.01); *H02K 2211/03* (2013.01)

(58) Field of Classification Search
CPC .. H05K 1/18; H02K 5/00; H02K 5/14; H02K 5/148; H02K 5/15; H02K 5/22;
(Continued)

(56) References Cited

U.S. PATENT DOCUMENTS

2003/0137202 A1   7/2003  Mao et al.
2005/0040715 A1   2/2005  Nesic
(Continued)

FOREIGN PATENT DOCUMENTS

JP   2003045554 A   2/2003
JP   2016137795 A   8/2016

OTHER PUBLICATIONS

International Search Report and Written Opinion dated Oct. 2, 2018, for corresponding PCT Application No. PCT/JP2018/028570.
(Continued)

*Primary Examiner* — Tran N Nguyen
(74) *Attorney, Agent, or Firm* — Kinney & Lange, P.A.

(57) ABSTRACT

A worm wheel is installed inside a wheel accommodation chamber of a body casing; a motor is fastened by screws from the right side perpendicular to the axis line of the worm wheel, thus forming a motor fastening part; and a worm fixed to an output shaft of the motor is engaged with the worm wheel. A board accommodation chamber is formed so as to be adjacent to the right of the wheel accommodation chamber, and a control board is inserted inside the board accommodation chamber from below. The control board is disposed so as to be inclined in a direction in which the upper end of the control board is displaced toward the wheel accommodation chamber from an erect attitude perpendicular to the axis line of the output shaft of the motor, and thus the upper end is separated from the motor fastening part in the direction of the axis line of the output shaft.

8 Claims, 10 Drawing Sheets

(51) Int. Cl.
*H02K 7/116* (2006.01)
*H05K 1/18* (2006.01)
*H02K 11/21* (2016.01)

(58) Field of Classification Search
CPC ........ H02K 5/225; H02K 11/00; H02K 11/04;
H02K 11/21; H02K 11/215; H02K 11/30;
H02K 11/38; H02K 7/00; H02K 7/11;
H02K 7/116; H02K 7/1166; H02K 15/00;
H02K 15/02; H02K 15/14; H02K 15/15
See application file for complete search history.

(56) References Cited

U.S. PATENT DOCUMENTS

| | | | |
|---|---|---|---|
| 2005/0280324 A1* | 12/2005 | Yamashita | H02K 5/225 310/75 R |
| 2010/0176696 A1* | 7/2010 | Mizutani | H02K 11/38 310/68 B |
| 2012/0161561 A1 | 6/2012 | Kuhnen | |

OTHER PUBLICATIONS

First Chinese Office Action dated Mar. 3, 2021, received for corresponding Chinese Application No. 201880042622.7, 14 pages.
International Preliminary Report on Patentability dated Feb. 13, 2020, received for corresponding Japanese Application No. PCT/JP2018/028570, 18 pages.

* cited by examiner

MOTOR UNIT EQUIPPED WITH DECELERATOR

CROSS-REFERENCE TO RELATED APPLICATION(S)

The present application is the national phase of PCT Application No. PCT/JP2018/028570 filed on Jul. 31, 2018, which claims priority to Japanese Application No. 2017-149348 filed on Aug. 1, 2017, the disclosures of which are incorporated by reference herein in their entireties.

TECHNICAL FIELD

The present disclosure relates to a motor unit equipped with a decelerator, and particularly relates to a motor unit equipped with a decelerator, the motor unit including a control board that controls drive of a motor and outputting rotation of the motor via a decelerator including a worm and a worm wheel.

BACKGROUND ART

A conventional motor unit equipped with a decelerator of this kind is, for example, a power window unit disclosed in Patent Literature 1. As illustrated in FIG. 1 of Patent Literature 1, a worm wheel is rotatably supported around its axis in a wheel housing defined by a main body casing of the power window unit. A motor is fastened to the main body casing with four screws in total on one side orthogonal to the axis of the worm wheel, and a worm fixed to an output shaft of the motor meshes the worm wheel. In the main body casing, a board housing is defined to be adjacent to the wheel housing on the one side of the wheel housing, and a control board is provided in the board housing.

The control board is electrically connected to the motor, receives power supply and operation signals from the outside via a connector directed to a side opposite the wheel housing, and controls drive of the motor in response to operation signals.

Patent Literature 1: U.S. Pub. No. 2003/0137202, specification

However, the power window unit disclosed in Patent Literature 1 is problematic in that both an appropriate board shape and compactification of the unit cannot be achieved at the same time.

Specifically, the motor is fastened to the main body casing with the four screws (hereinafter, referred to as "motor fastening portions") as described above, and those motor fastening portions are positioned to overlap the control board in a direction of an axis of the output shaft of the motor. Therefore, in order to prevent interference with two motor fastening portions on a side near the control board, large relief portions are formed on both sides of the control board.

Such an irregular board shape is a factor that greatly increases a manufacturing cost of the control board and is also a factor that reduces reliability of the power window unit due to a difficulty in achieving an optimal arrangement of elements on the board due to reduction in an area of the board.

In order to solve the above problems, it is considered that, as a countermeasure, positions of the motor fastening portions are displaced in a direction away from the main body casing, so as to avoid the overlap between the motor fastening portions and the control board. However, the motor itself is also arranged apart from the main body casing in accordance with such displacement of the positions of the motor fastening portions. Thus, the power window unit is disadvantageously increased in size in the direction of the axis of the output shaft of the motor.

As a result, the power window unit disclosed in Patent Literature 1 cannot avoid one of the following disadvantages: restriction of the board shape; and an increase in size of the unit. Therefore, a drastic countermeasure has been conventionally desired.

The present disclosure has been made to solve such problems, and an object thereof is to provide a motor unit equipped with a decelerator, the motor unit having an appropriate board shape without being increased in size, thereby achieving compactness, and achieving cost reduction of a control board and improvement in reliability caused by optimal arrangement of elements on the board.

SUMMARY

A motor unit equipped with a decelerator in the present disclosure includes: a worm wheel provided in a wheel housing of a main body casing and rotatably supported around an axis; a motor fastened to the main body casing with a fastening member from one side orthogonal to the axis of the worm wheel and in which a worm fixed to an output shaft meshes with the worm wheel; a board housing defined by the main body casing so as to be adjacent to the wheel housing on the one side of the wheel housing; and a control board provided in the board housing in a posture of crossing an axis of the output shaft of the motor, electrically connected to the motor, and including, on the one side, a connector to be connected to the outside, in which the control board is inclined from a posture orthogonal to the axis of the output shaft of the motor toward a direction in which a position of an end portion on the motor side is displaced toward the other side, so that the end portion on the motor side is apart from a fastening portion including the fastening member in a direction of the axis of the output shaft.

According to the motor unit equipped with a decelerator configured as described above, overlap between the control board and the fastening portion is avoided in the direction of the axis of the output shaft of the motor. Therefore, it is unnecessary to form a relief portion in the control board in order to prevent interference with the fastening portion. Thus, it is possible to solve the restriction regarding the board shape and achieve the control board having an appropriate board shape, for example, a general rectangular shape. Further, as, for example, the technology disclosed in Patent Literature 1, it is unnecessary to displace a position of the fastening portion in a direction away from the main body casing in order to avoid the overlap between the control board and the fastening portion, and thus an increase in size of the unit is avoided.

As another aspect, it is preferable that the board housing have an opening on a side opposite the motor, a connector cover included in the connector be detachably provided on the board housing so as to close the opening, and the control board be inserted into the board housing from the side opposite the motor through the opening along a plate surface.

According to the motor unit equipped with a decelerator configured as described above, the opening of the board housing is required to have a size only capable of avoiding interference between the control board to be inserted along the plate surface and attached elements, and thus a small opening satisfactorily functions. As a result, the main body casing is advantageous in strength, as compared with a case where a large opening is formed.

As another aspect, it is preferable that a waterproof packing be interposed between the opening of the board housing and the connector cover.

According to the motor unit equipped with a decelerator configured as described above, a seal length required for waterproofing is reduced. Therefore, it is possible to reduce a size of the waterproof packing, and difficulty of waterproofing is reduced.

As another aspect, it is preferable that: the opening of the board housing be open in an oblique direction toward the side opposite the motor and the one side; a connector terminal included in the connector together with the connector cover protrude from the control board toward the one side through the opening; and the connector cover include the connector terminal and be provided in the opening of the board housing from the one side so as to close the opening.

According to the motor unit equipped with a decelerator configured as described above, a simple shape of the opening of the board housing, which is open in the oblique direction, achieves both the insertion of the control board and the protrusion of the connector terminal. Therefore, a configuration in the vicinity of the opening is simplified As another aspect, it is preferable that: the control board include a board-side terminal in a portion on the motor side of the control board and be electrically connected to the motor by fitting a motor-side terminal of the motor fastened to the main body casing into the board-side terminal from the one side; and, because of the inclination of the control board, a position of the board-side terminal and the position of the end portion on the motor side of the control board be displaced toward the other side.

According to the motor unit equipped with a decelerator configured as described above, the position of the board-side terminal is displaced toward the other side together with the position the end portion on the motor side of the inclined control board, and thus the position of the motor is also displaced toward the other side in accordance with the displacement. As a result, the unit is reduced in size.

As another aspect, it is preferable that: the control board include a board-side terminal in a portion on the motor side of the control board and be electrically connected to the motor by fitting a motor-side terminal of the motor fastened to the main body casing into the board-side terminal from the one side; and the board housing include a terminal guide portion that corrects the position of the board-side terminal of the control board inserted from the side opposite the motor through the opening.

According to the motor unit equipped with a decelerator configured as described above, although the position of the small board-side terminal having low rigidity tends to be shifted due to inclination or the like, the position is corrected by the terminal guide portion. Therefore, it is possible to securely fit the motor-side terminal into the board-side terminal.

As another aspect, it is preferable that: the control board include a board-side terminal in a portion on the motor side of the control board and be electrically connected to the motor by fitting a motor-side terminal of the motor fastened to the main body casing into the board-side terminal from the one side; and the board housing include a terminal position regulating portion that, when the motor-side terminal is fitted into the board-side terminal, abuts against the board-side terminal from the other side and regulates a position of the board-side terminal.

According to the motor unit equipped with a decelerator configured as described above, although, when the board-side terminal is fitted, the board-side terminal receives pressing force from the motor-side terminal, the position is regulated by the terminal position regulating portion via the control board. Therefore, it is possible to securely fit the motor-side terminal into the board-side terminal without moving or deforming the board-side terminal.

As another aspect, it is preferable that: the control board include a board-side terminal in a portion on the motor side of the control board and be electrically connected to the motor by fitting a motor-side terminal of the motor fastened to the main body casing into the board-side terminal from the one side; and the board housing include a terminal position regulating portion that, when the motor-side terminal is fitted into the board-side terminal, abuts against the board-side terminal from the other side and regulates a position of the board-side terminal.

According to the motor unit equipped with a decelerator configured as described above, although, when the board-side terminal is fitted, the board-side terminal receives pressing force from the motor-side terminal, a warp and deformation of the control board is prevented by regulation of the position performed by the terminal position regulating portion. Therefore, the position of the board-side terminal is also regulated, and thus it is possible to securely fit the motor-side terminal into the board-side terminal without moving or deforming the board-side terminal.

As another aspect, it is preferable that, because of the inclination of the control board, a portion on the side opposite the motor of the board housing be separated from the wheel housing toward the one side, and, in a space secured by the separation, a locking portion that allows one side of the connector cover to be detachable be provided.

According to the motor unit equipped with a decelerator configured as described above, the portion on the side opposite the motor of the board housing is separated from the wheel housing toward the one side, and the space secured by this separation is used for providing the locking portion. Therefore, it is possible to fix the one side of the connector cover according to a simple lock principle, without employing a complicated fixing structure.

As another aspect, it is preferable that: the wheel housing be defined in such a manner that one side surface along the axis of the worm wheel is closed by a cover member, and, because of the inclination of the control board, a portion on the side opposite the motor of the board housing be separated from the wheel housing toward the one side; and, in a space secured by the separation, a circumference of the cover member be joined with a circumference of the wheel housing by a crimping process.

According to the motor unit equipped with a decelerator configured as described above, the portion on the side opposite the motor of the board housing is separated from the wheel housing toward the one side, and the space secured by this separation is used for the crimping process. Therefore, it is possible to join the cover member with the wheel housing by a simple crimping process, without employing a complicated joining structure.

A motor unit equipped with a decelerator in the present disclosure can have an appropriate board shape without being increased in size, thereby achieving compactness, and achieving cost reduction of a control board and improvement in reliability caused by optimal arrangement of elements on the board.

DETAILED DESCRIPTION OF EMBODIMENTS

Hereinafter, there will be described an embodiment in which the present disclosure is embodied as a power window unit that is provided in a door of a vehicle and raises and lowers a window.

Figure 1:
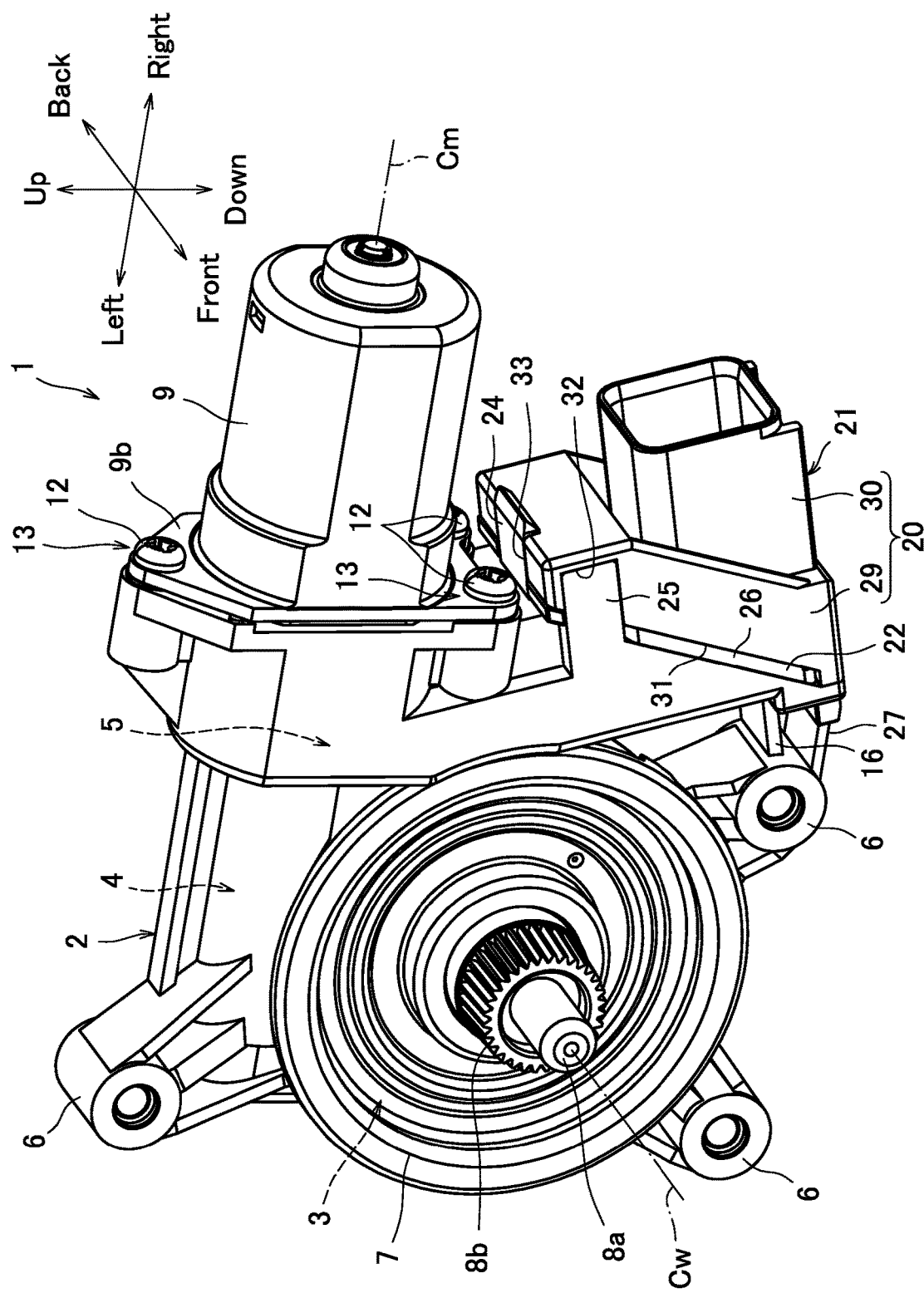
FIG. 1 is a perspective view of a power window unit according to an embodiment.
Figure 2:
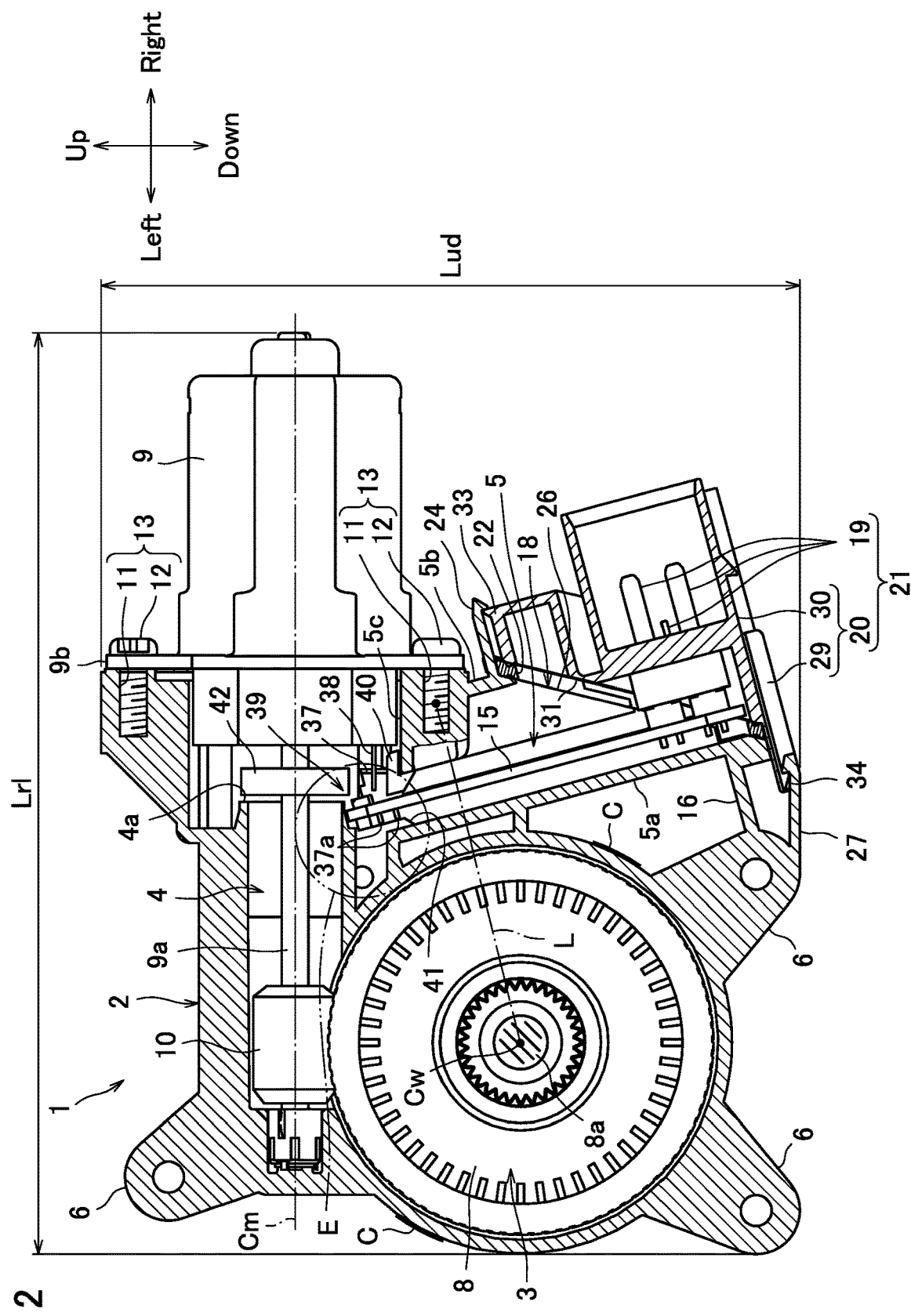
FIG. 2 is a cross-sectional view of the power window unit.
Figure 3:
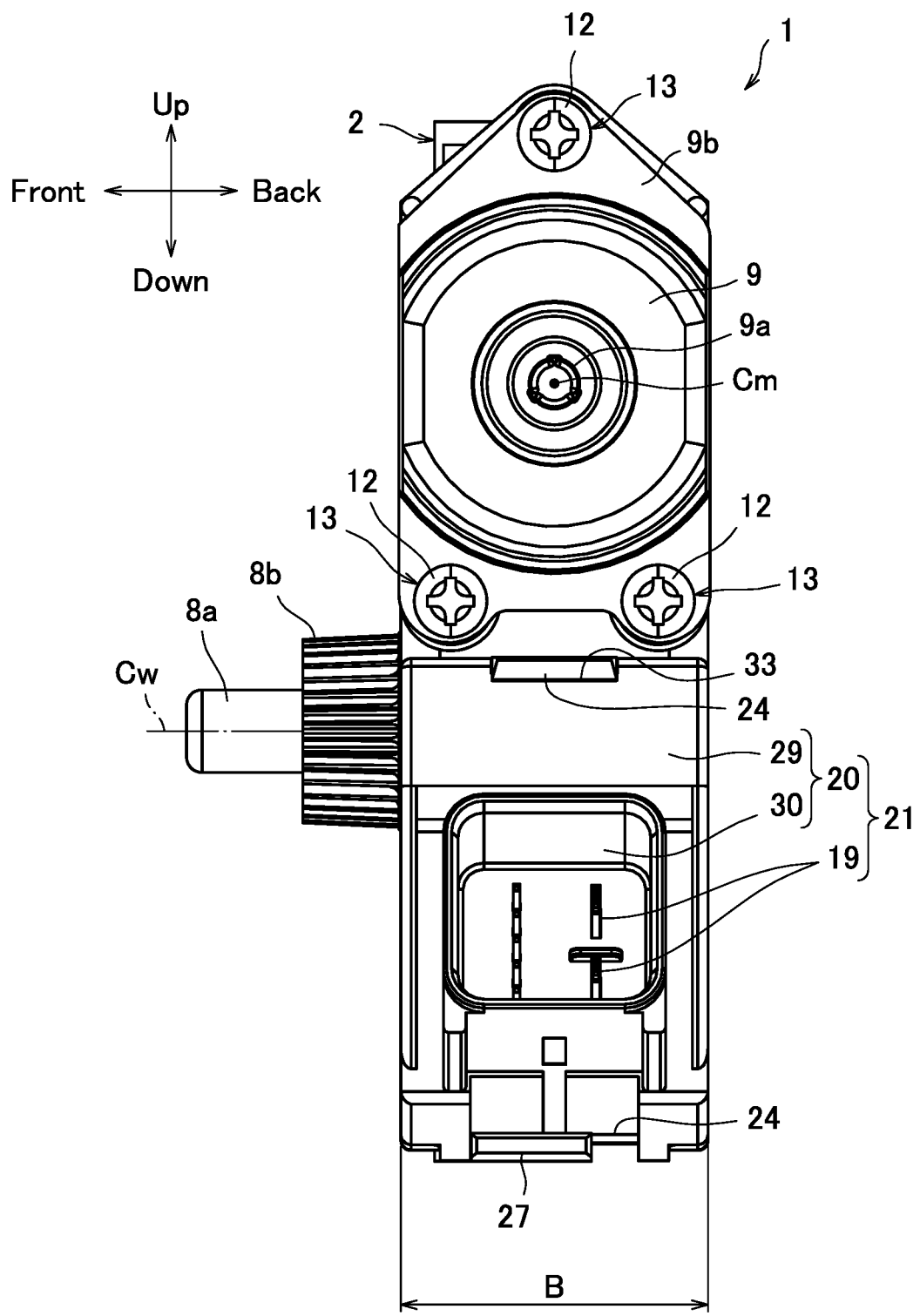
FIG. 3 is a right side view of the power window unit in FIG. 1.

FIG. 1 is a perspective view of a power window unit in this embodiment. FIG. 2 is a cross-sectional view of the power window unit. FIG. 3 is a right side view of the power window unit in FIG. 1. In the following description, up-and-down and left-and-right directions are defined as in FIG. 2, and a direction orthogonal to a sheet of paper in FIG. 2 is referred to as "front-and-back direction".

Herein, correspondence regarding expressions of directions between this embodiment and the present disclosure will be described before description of this embodiment. A right side in this embodiment corresponds to one side in the present disclosure, and a left side in this embodiment corresponds to the other side in the present disclosure. Further, an upper side, an upper position, an upper end, and an upper portion in this embodiment correspond to a motor side in the present disclosure, and a lower side, a lower position, a lower end, and a lower portion in this embodiment correspond to a side opposite the motor in the present disclosure.

A main body casing 2 of a power window unit 1 is made from resin, and a wheel housing 3, a worm housing 4, and a board housing 5 described below are integrally formed. The wheel housing 3 has a circular shape in front view, and attaching brackets 6 are integrally formed at two, i.e., left and right, lower positions and one upper position of the wheel housing 3. The wheel housing 3 has a predetermined thickness in the front-and-back direction and has an opening in its front surface (corresponding to one side surface in the present disclosure), and a front cover 7 (corresponding to a cover member in the present disclosure) which is obtained by press-molding an aluminum plate is provided at a position of the opening.

Two positions facing each other at 180° on a circumference of the front cover 7 (indicated by C in FIG. 2) are joined with a circumference of the wheel housing 3 by a crimping process. With this configuration, the opening portion is closed, and thus the wheel housing 3 is defined. In the wheel housing 3, a worm wheel 8 is rotatably supported around an axis Cw extending in the front-and-back direction, and an output shaft 8a of the worm wheel 8 penetrates the front cover 7 and protrudes toward a front side.

At an upper position of the wheel housing 3 of the main body casing 2, the worm housing 4 is provided by drilling from the right side, and inside of the worm housing 4 communicates with an upper portion of the wheel housing 3 positioned under the worm housing 4. In the worm housing 4, an output shaft 9a of a motor 9 with a brush (hereinafter, simply referred to as "motor") is inserted from the right side orthogonal to the axis Cw of the worm wheel 8, and a worm 10 fixed to the output shaft 9a meshes with the worm wheel 8.

Female screw portions 11 are formed at one upper position and two lower positions around the worm housing 4 on a right side surface of the main body casing 2, and screws 12 (fastening members) penetrate a flange portion 9b of the motor 9 and are engaged with the respective female screw portions 11. In this way, the motor 9 is fastened to the main body casing 2. Hereinafter, three fastening portions including the screws 12 and the female screw portions 11 will be referred to as "motor fastening portions 13" (corresponding to a fastening portion in the present disclosure).

The power window unit 1 is attached to a predetermined position in the door of the vehicle via the three attaching brackets 6, and connection bars 8b formed on the output shaft 8a of the worm wheel 8 are connected to a window raising/lowering mechanism. Then, when the output shaft 9a of the motor 9 is rotated in a predetermined direction, the rotation is decelerated via the worm 10 and the worm wheel 8 and is then transmitted from the output shaft 8a to the window raising/lowering mechanism, and thus the window is raised or lowered in accordance with the direction of rotation.

In the main body casing 2, the board housing 5 is defined to be adjacent to the wheel housing 3 on the right side of the wheel housing 3. The board housing 5 has a shape extended in the up-and-down direction as a whole, and, in the board housing 5, a control board 15 is provided in a posture in which a left side surface thereof faces the wheel housing 3, in other words, a posture in which the control board 15 crosses an axis Cm of the output shaft 9a of the motor 9. Although details will be described below, an upper portion of the control board 15 is electrically connected to the motor 9, and power supply and an operation signal are input thereto from the outside via a connector 21 provided in a lower portion of the control board 15.

With such arrangement of the control board 15 in the main body casing 2, it is possible to use the common control board 15 between the power window units 1 for left and right doors and use the bilateral symmetric main body casings 2 of the same design.

Further, the control board 15 has a function of controlling drive of the motor 9. The control board 15 drives the motor 9 based on, for example, an operation signal that is input in response to raising or lowering operation of the window, determines a raising or lowering position of the window based on a motor rotation angle detected by a rotation angle sensor 42 described below, and automatically stops the motor 9 at a fully closed position or a fully open position. Such an arrangement state of the control board 15 in the board housing 5, an electrical connection structure with the motor 9, and a connector structure are features of the present disclosure and will therefore be described in detail below.

As is clear from the above description, a layout of the worm wheel 8, the motor 9, and the control board 15 of the power window unit 1 in this embodiment is basically similar to that disclosed in Patent Literature 1. Therefore, in a case where the motor fastening portion 13 is positioned to overlap the control board 15 in a direction of the axis Cm of the output shaft 9a of the motor 9, it is necessary to form relief portions in the control board 15 in order to prevent interference with the two motor fastening portions 13 on the lower side in particular. Further, when positions of the motor fastening portions 13 are displaced toward the right side to be apart from the main body casing 2 in order to avoid the overlap, the power window unit 1 is increased in size in the direction of the axis Cm (left-and-right direction) of the output shaft 9a.

In view of such disadvantages, the inventors of the present disclosure noticed that an area E in FIG. 2 formed among the wheel housing 3, the worm housing 4, and the board housing 5 was an unused dead space. That is, instead of displacing the positions of the motor fastening portions 13 toward the right side as in the countermeasure described above, a position of an upper end of the control board 15 (corresponding to an end portion on a motor side in the present disclosure) is displaced toward the left side and the upper end of the control board 15 is provided in the dead space. With this configuration, the upper end of the control board 15 is separated from the motor fastening portions 13 in the direction of the axis Cm of the output shaft 9a of the motor 9. Therefore, it is possible to avoid the overlap between the motor fastening portions 13 and the control board 15. As a result, it is possible to prevent the unit 1 from being increased in size due to displacement of the positions of the motor fastening portions 13 and also possible to maintain an appropriate board shape having no relief portion because the overlap is avoided.

Meanwhile, a space is desirably secured between a lower end of the control board 15 and the wheel housing 3 by separating the lower end of the control board 15 from the wheel housing 3 toward the right side. Although details thereof will be described below, the space is secured for the purpose of performing the above-mentioned crimping process of the front cover 7 with respect to the wheel housing 3 and performing fixation of a connector cover 20 to an opening 18 of the board housing 5 described below.

As a result, in this embodiment, the control board 15 is inclined from a posture (upright posture) of the control board 15 orthogonal to the axis Cm of the output shaft 9a of the motor 9, so that a position of the upper end is displaced toward the left side and a position of the lower end is displaced toward the right side. More accurately, the control board 15 is inclined in a direction orthogonal to an imaginary line L connecting the axis Cw of the worm wheel 8 and the lower motor fastening portions 13. In addition, although the direction of this inclination is similar to that of the control board disclosed in Patent Literature 1, the present disclosure is fundamentally different from Patent Literature 1 in that the upper end of the control board 15 is separated from the motor fastening portions 13 in the direction of the axis Cm of the output shaft 9a of the motor 9 so as to avoid the overlap. Because of this difference, the present disclosure has a remarkable effect. Hereinafter, the control board 15 and a peripheral configuration thereof will be described in detail below.

Because of the above-mentioned inclination of the control board 15, the board housing 5 in which the control board 15 is provided is also defined to have a shape inclined in the corresponding direction. That is, a left wall 5a of the board housing 5 is extended in the up-and-down direction of the whole board housing 5, and an upper portion of the left wall 5a is brought close to the wheel housing 3 and is substantially directly connected thereto. As a result, the upper portion is positioned in the above-mentioned dead space.

Further, a lower portion of the left wall 5a is connected to the attaching bracket 6 on the lower right side of the wheel housing 3 via a plate-like connection bar 16. Therefore, the lower portion of the left wall 5a (corresponding to a portion on a side opposite a motor in the present disclosure) is separated from the wheel housing 3 toward the right side by a distance corresponding to a length of the connection bar 16. As a result, a space is secured between a lower portion of the board housing 5 and a lower portion of the wheel housing 3.

In the following description, the control board 15 will be mainly described step by step in order to easily understand the present disclosure. First, a peripheral configuration of the lower portion of the control board 15 and effects thereof will be described. Next, a peripheral configuration of the upper portion of the control board 15 and effects thereof will be described. Finally, effects regarding the posture of the control board 15 will be described.

[Peripheral Configuration of Lower Portion of Control Board 15]

Figure 4:
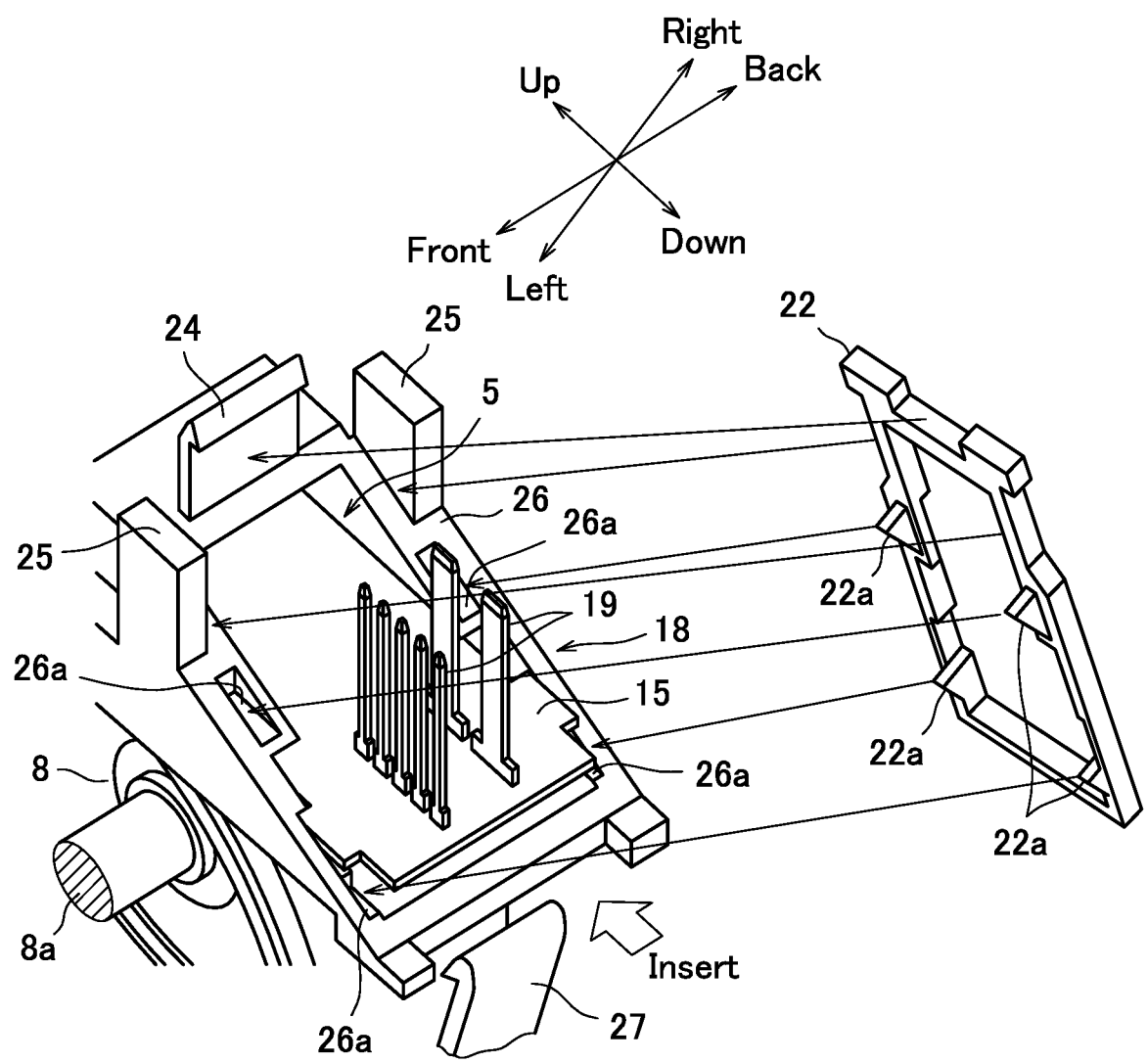
FIG. 4 is a perspective view of an opening of a board housing before a waterproof packing is attached.
Figure 5:
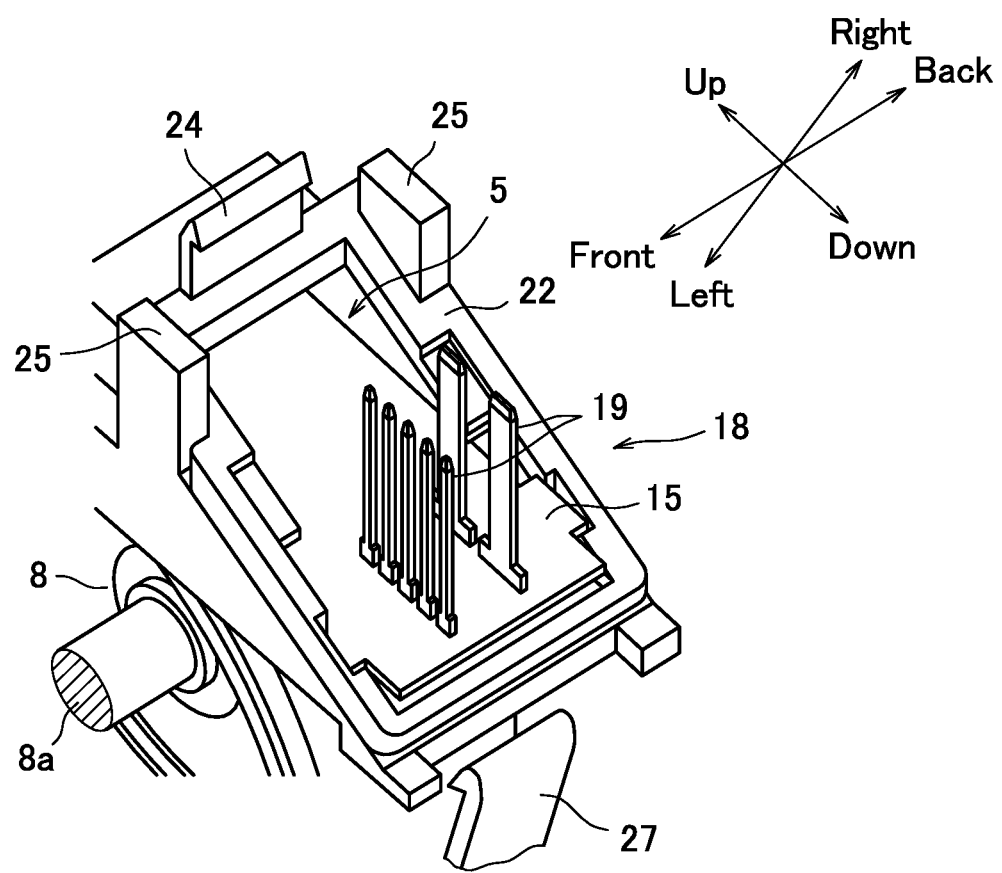
FIG. 5 is a perspective view of the opening of the board housing after the waterproof packing is attached.
Figure 6:
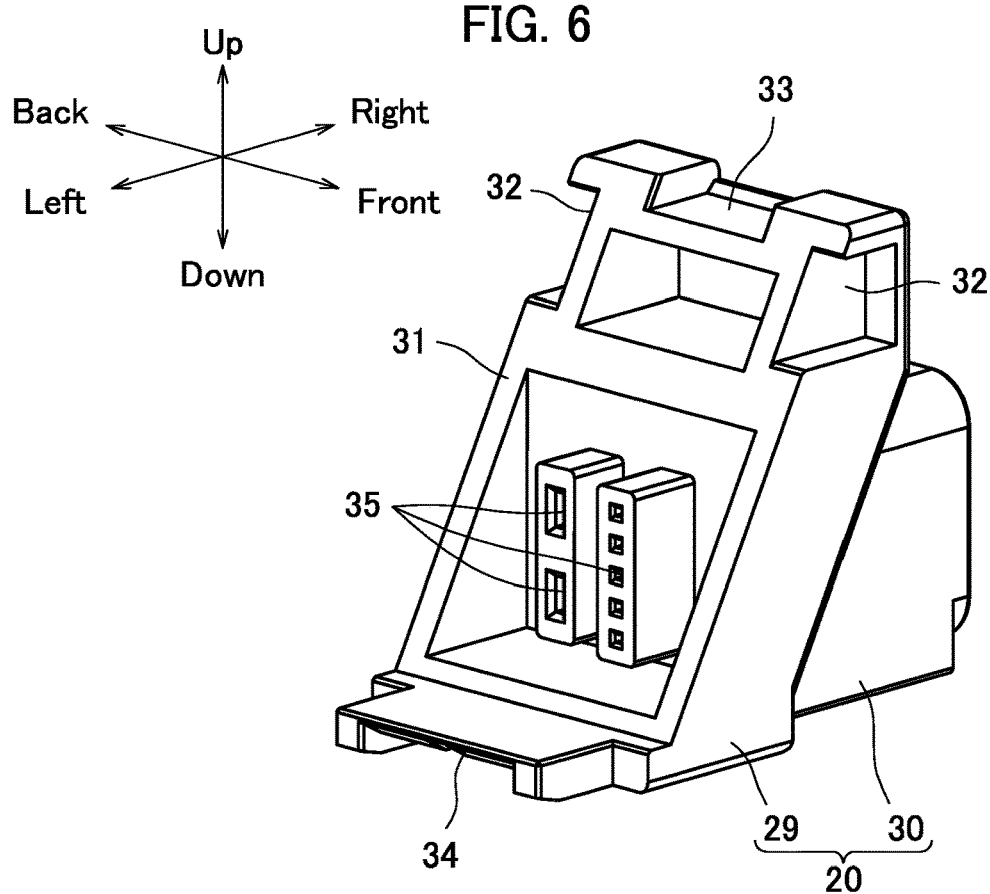
FIG. 6 is a perspective view of a connector cover.

FIG. 4 is a perspective view of the opening of the board housing 5 before a waterproof packing is attached. FIG. 5 is a perspective view of the opening of the board housing 5 after the waterproof packing is attached. FIG. 6 is a perspective view of the connector cover.

As illustrated in FIGS. 2, 4, and 5, the left wall 5a is extended in the up-and-down direction of the whole board housing 5, whereas a right wall 5b is separated toward the right side in order to secure a space for arranging the control board 15 and is mainly formed on an upper half side of the board housing 5. The opening 18 into which the control board 15 is inserted is formed in the lower portion of the board housing 5. Because a lower end of the right wall 5b is positioned above a lower end of the left wall 5a, the opening 18 opens in an oblique direction toward the lower side and the right side and has an opening end of a substantially rectangular shape.

Because the opening 18 faces in the oblique direction as described above, it is possible to insert the control board 15 into the board housing 5 from below along a plate surface and arrange the control board 15 inside the board housing 5, as indicated by an arrow in FIG. 4. Note that, at the time of the insertion, the control board 15 is guided while having a play because of recessed grooves 5d (illustrated in FIG. 11) formed on both front and back sides of the inside of the board housing 5.

A plurality of connector terminals 19 protrudes toward the right side from the lower portion of the control board 15 inserted into the board housing 5, and those connector terminals 19 are classified into terminals for power supply or terminals for operation signals. Each of the connector terminals 19 protrudes toward the right side through the opening 18 facing in the oblique direction, and, as described below, those connector terminals 19 and the connector cover 20 described below form the connector 21 into which power supply and operation signals are input.

The connector cover 20 in FIG. 6 forms the connector 21 together with the connector terminals 19 and, in addition, is detachably fixed to the opening 18 of the board housing 5 and therefore has a function of closing the opening. Herein, the power window unit 1 needs to have a waterproof property, and thus a waterproof packing 22 for maintaining liquid tightness is interposed between the opening 18 of the board housing 5 and the connector cover 20. This waterproof packing 22 is positioned and fixed on the opening 18 side of the board housing 5, and thus, an attaching state of the waterproof packing 22 to the opening 18 will be described before description of the connector cover 20.

An upper locking claw 24 protrudes from an upper portion of the opening 18 of the board housing 5, and a pair of regulating pillars 25 protrudes from both the front and back sides of the upper portion of the opening 18 in a direction parallel to the above-mentioned connector terminals 19. The opening 18 of the board housing 5 has a shape to avoid the front and back regulating pillars 25. A flat seal surface 26 is continuously provided in the form of strip on the whole circumference of the opening 18, and positioning recessed portions 26a are formed at four positions on the seal surface 26.

The waterproof packing 22 has a substantially rectangular shape corresponding to a shape of the seal surface 26 of the opening 18, and, on a surface of the waterproof packing 22, the surface facing the opening 18, positioning protruding portions 22a are formed corresponding to the positioning recessed portions 26a. The waterproof packing 22 is arranged on the seal surface 26 of the opening 18, and the positioning protruding portions 22a of the waterproof packing 22 are fitted into the corresponding positioning recessed portions 26a on the seal surface 26. This prevents a positional shift of the waterproof packing 22 from a proper position on the seal surface 26. Further, at this time, the regulating pillars 25 and the upper locking claw 24 also prevent a positional shift of the waterproof packing 22 toward an outer circumferential side.

The positional shift of the waterproof packing 22 is prevented by fitting the positioning recessed portions 26a and the positioning protruding portions 22a into each other on the seal surface 26 as described above. The reason for this is as follows.

It is necessary to sufficiently secure an area of the board in order to achieve optimal arrangement of elements on the control board 15, whereas the board housing 5 in which the control board 15 is arranged needs to be reduced in size as much as possible in order to reduce the size of the power window unit 1. Therefore, the opening 18 is also set to a minimum size at which the control board 15 is insertable.

In general positioning of the waterproof packing 22, a wall for preventing the positional shift of the waterproof packing 22 is formed on an inner circumferential side or outer circumferential side of the seal surface 26. However, this increases the size of the opening 18 and the board housing 5 by a length corresponding to a thickness of the wall. In order to avoid such a circumstance, the positioning recessed portions 26a and the positioning protruding portions 22a are fitted into each other on the seal surface 26. This makes it possible to reduce the size of the board housing 5 as much as possible and particularly reduce a thickness in the front-and-back direction of the power window unit 1 (indicated by B in FIG. 3).

Meanwhile, as illustrated in FIGS. 2 and 5, a lower locking claw 27 (locking portion) protrudes from the lower right attaching bracket 6 of the wheel housing 3 toward the right side so as to be provided below the connection bar 16, and a tip of the lower locking claw 27 is positioned below the opening 18 of the board housing 5. Further, the above-mentioned upper locking claw 24 and the lower locking claw 27 cooperatively fix the connector cover 20 to the opening 18 of the board housing 5 as described below.

As illustrated in FIGS. 2 and 6, the connector cover 20 is provided by integrally forming a cover portion 29 that closes the opening 18 of the board housing 5 and a connector portion 30 that includes and support the connector terminals 19 of the control board 15.

The cover portion 29 has a substantially rectangular shape corresponding to the shape of the opening 18 of the board housing 5. A flat seal surface 31, which is similar to the seal surface attached to the opening 18, is formed on the whole circumference of the cover portion 29. In addition, regulating recessed portions 32 into which the regulating pillars 25 of the opening 18 are fitted are formed on both the front and back sides. Further, an upper locking portion 33 to be locked with the above-mentioned upper locking claw 24 is formed on an upper portion of the cover portion 29, and a lower locking portion 34 to be locked with the lower locking claw 27 is formed on a lower portion of the cover portion 29.

Meanwhile, the connector portion 30 has a rectangular tube shape protruding from the cover portion 29 and has an inclination with respect to the cover portion 29 in front view. Thus, in a state in which the connector cover 20 is fixed to the opening 18 of the board housing 5, the connector portion 30 is directed toward the right side. Terminal holes 35 into which the respective connector terminals 19 of the control board 15 are to be inserted are penetratingly provided on a base end (cover portion 29 side) of the connector portion 30, and inside of the cover portion 29 communicates with inside of the connector portion 30 via those terminal holes 35.

When the connector cover 20 is brought close to the opening 18 of the board housing 5 from the right side in a proper posture in order to fix the connector cover 20 to the opening 18 of the board housing 5, first, the regulating pillars 25 positioned on the front and back sides of the opening 18 are inserted into the regulating recessed portions 32 of the connector cover 20. Therefore, the connector 21 is brought close to the opening 18 while a position of the connector 21 is being regulated in the front-and-back and up-and-down directions, and the seal surface 31 thereof is securely provided at a proper position so as to correspond to the seal surface 26 of the opening 18.

In parallel to this, the connector terminals 19 of the control board 15 are inserted into and supported by the corresponding terminal holes 35 of the connector cover 20, and tips of the connector terminals 19 protrude into the connector portion 30 and are included in the connector portion 30. Also at this time, a position of the connector 21 is regulated by engagement between the regulating pillars 25 and the regulating recessed portions 32, and thus the connector terminals 19 are securely inserted into the corresponding terminal holes 35. Further, movement of the lower portion of the control board 15 is regulated in the board housing 5 by support from the connector cover 20 side via the connector terminals 19.

Thereafter, when the upper and lower locking claws 24 and 27 on the opening 18 side are locked with the upper and lower locking portions 33 and 34 of the connector cover 20, respectively, the connector cover 20 is prevented from separating from the opening 18 toward the right side. Also at this time, the regulating pillars 25 and the regulating recessed portions 32 are continuously engaged with each other. Therefore, movement of the connector cover 20 in the front-and-back and up-and-down directions is regulated, and the connector cover 20 is securely fixed at a proper position on the opening 18. As a result, the opening 18 of the board housing 5 is closed by the cover portion 29 of the connector cover 20, and the waterproof packing 22 is interposed between the seal surface 31 of the cover portion 29 and the seal surface 26 of the opening 18, thereby maintaining liquid tightness.

[Effects Obtained by Peripheral Configuration of Lower Portion of Control Board 15]

Next, there will be described effects obtained by the peripheral configuration of the lower portion of the control board 15 configured as described above.

First, the opening 18 is formed in the lower portion of the board housing 5, and the control board 15 is inserted into the board housing 5 from below along the plate surface. In, for example, the technology disclosed in Patent Literature 1, the control board is inserted into the board housing from a direction orthogonal to the plate surface, and thus it is necessary to open the board housing at a size that is at least equal to or larger than the control board. Because the large opening is formed, the main body casing is disadvantageous in strength, and a seal length required for waterproofing is extended. Therefore, an increase in cost caused by an increase in size of the waterproof packing 22 and reduction in reliability caused by an increase in difficulty of waterproofing are inevitable.

On the contrary, as illustrated in FIGS. 4 to 6, the opening 18 in this embodiment is required to have a size only capable of avoiding interference between the control board 15 to be inserted along the plate surface and the attached elements, and thus the particularly small opening 18 satisfactorily functions. As a result, the main body casing 2 is advantageous in strength and is therefore thinned while maintaining strength equivalent to that of the main body casing of the technology disclosed in Patent Literature 1, thereby achieving reduction in weight. Further, the seal length required for waterproofing is remarkably reduced. Therefore, because of reduction in size of the waterproof packing 22, it is possible to achieve cost reduction and improvement in reliability caused by reduction in difficulty of waterproofing.

Further, the opening 18 of the board housing 5 in this embodiment is open in the oblique direction so as to be directed toward not only the lower side but also the right side. Therefore, the connector terminals 19 of the control board 15 are caused to protrude toward the right side through the opening 18 and are joined with the connector cover 20, thereby forming the connector 21. Specifically, a simple shape of the opening 18 of the board housing 5, which is open in the oblique direction toward the lower side and the right side, achieves both the insertion of the control board 15 from below and the protrusion of the connector terminals 19 toward the right side. Therefore, it is possible to simplify a configuration in the vicinity of this opening 18. With this, it is possible to achieve further cost reduction.

Further, in order to incline the control board 15, the lower portion of the board housing 5 is separated from the attaching bracket 6 of the wheel housing 3 toward the right side via the connection bar 16. As a result, a space is secured between the lower portion of the board housing 5 and the lower portion of the wheel housing 3. This space is used for performing the crimping process of the front cover 7 with respect to the wheel housing 3 and providing the lower locking claw 27 that fixes the connector cover 20.

First, the crimping process of the front cover 7 will be described. In order to join the front cover 7 with the wheel housing 3, it is necessary to perform a crimping process at at least two positions facing each other at 1800 on the circumference thereof, and it is also necessary to avoid positions of the worm housing 4 and the attaching brackets 6. Therefore, as illustrated in FIG. 2, one position C of the crimping process is limited to a position between the wheel housing 3 and the board housing 5. In a case where the lower portion of the board housing 5 is close to the lower portion of the wheel housing 3, there is no space for performing the crimping process due to interference with the board housing 5. Therefore, it is necessary to employ another complicated joining structure.

In this embodiment, it is possible to satisfactorily perform the crimping process at the position C by using the space secured by the connection bar 16. Thus, it is possible to join the front cover 7 with the wheel housing 3 by a simple crimping process, without employing the complicated joining structure. This also greatly contributes to cost reduction.

Next, provision of the lower locking claw 27 will be described. As in the above-mentioned crimping process, in a case where the lower portion of the board housing 5 is close to the lower portion of the wheel housing 3, there is no space for providing the lower locking claw 27 due to interference with the board housing 5. Therefore, it is necessary to fix the lower portion of the connector cover 20 with a complicated fixing structure other than the locking claw.

In this embodiment, the lower locking claw 27 can be satisfactorily provided by using the space secured by the connection bar 16. Therefore, it is possible to fix the lower portion of the connector cover 20 according to a simple lock principle, without employing the complicated fixing structure. This also greatly contributes to cost reduction.

[Peripheral Configuration of Upper Portion of Control Board 15]

Next, the peripheral configuration of the upper portion of the control board 15 will be described.

Figure 7:
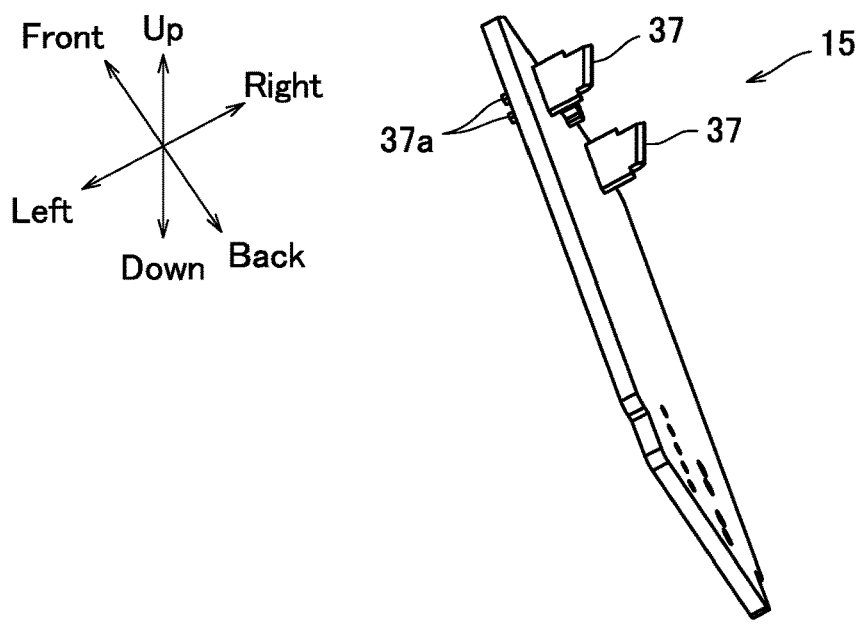
FIG. 7 is a perspective view of a control board.

FIG. 7 is a perspective view of the control board 15. FIG. 7 illustrates the control board 15 in a posture corresponding to the posture in FIG. 2 and does not illustrate the elements and the connector terminals 19 on the board.

First, a configuration of the control board 15 will be described with reference to FIG. 7. The control board 15 has no relief portion as a whole, unlike the control board disclosed in Patent Literature 1, and has a rectangular shape. Although a detailed reason for this will be described below, this is because it is unnecessary to prevent interference with the two lower motor fastening portions 13.

A pair of board-side terminals 37 (positive pole and negative pole) to be electrically connected to the motor 9 is provided on the upper portion of the control board 15. The board-side terminals 37 are positioned at a predetermined interval in the front-and-back direction so as to protrude toward the right side. The board-side terminals 37 have a flat plate shape in the front-and-back direction. A pair of upper and lower press-fit terminals 37a is integrally provided to protrude on left sides of the corresponding board-side terminals 37. The press-fit terminals 37a are press-fitted into holes formed in the control board 15, and thus the board-side terminals 37 are fixed onto the control board 15. The press-fit terminals 37a protrude from the control board 15 toward the left side.

Figure 8:
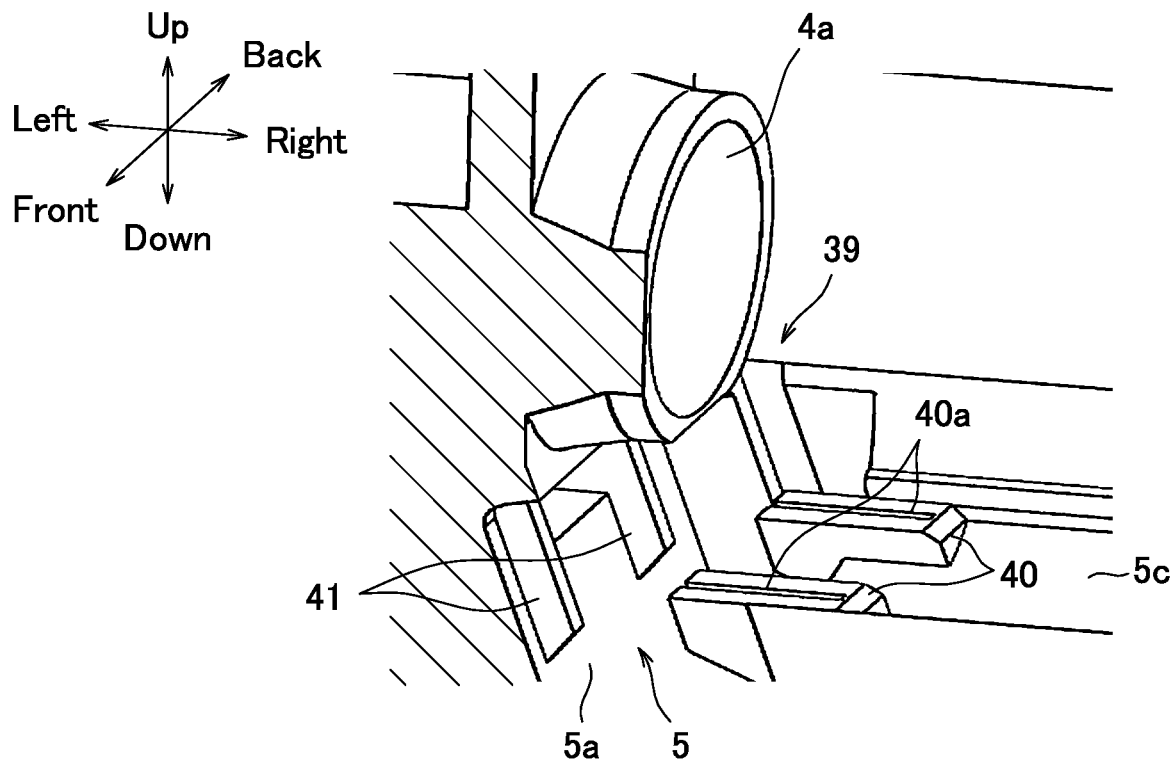
FIG. 8 is a perspective view of an upper portion of a board housing before a control board is inserted.
Figure 9:
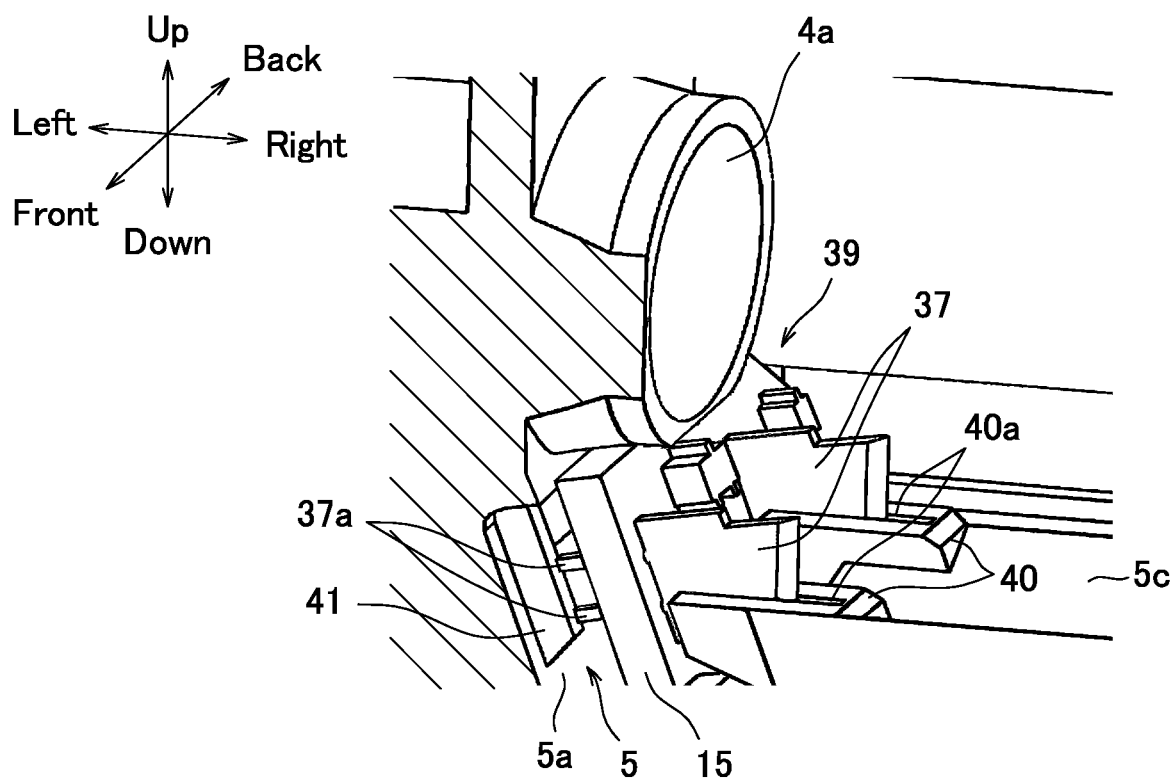
FIG. 9 is a perspective view of the upper portion of the board housing after the control board is inserted.
Figure 10:
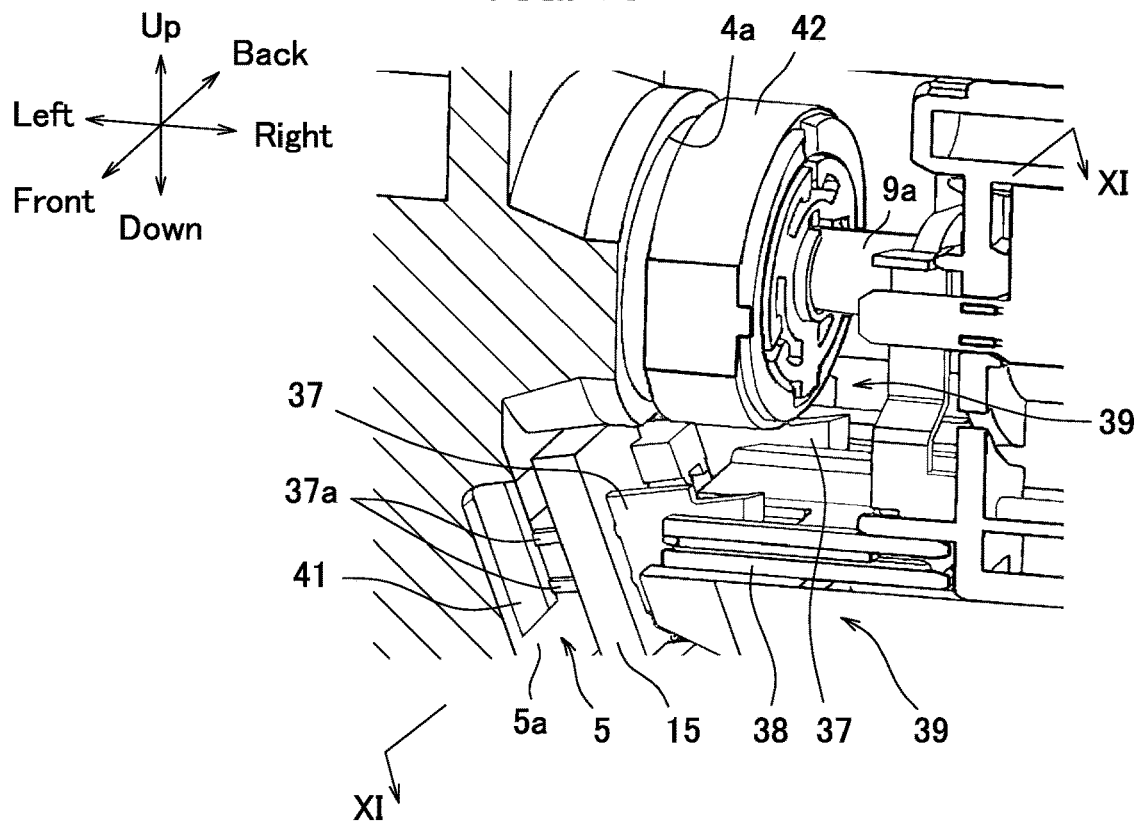
FIG. 10 is a perspective view of an upper portion of a board housing, which illustrates a state in which motor-side terminals are fitted into board-side terminals.
Figure 11:
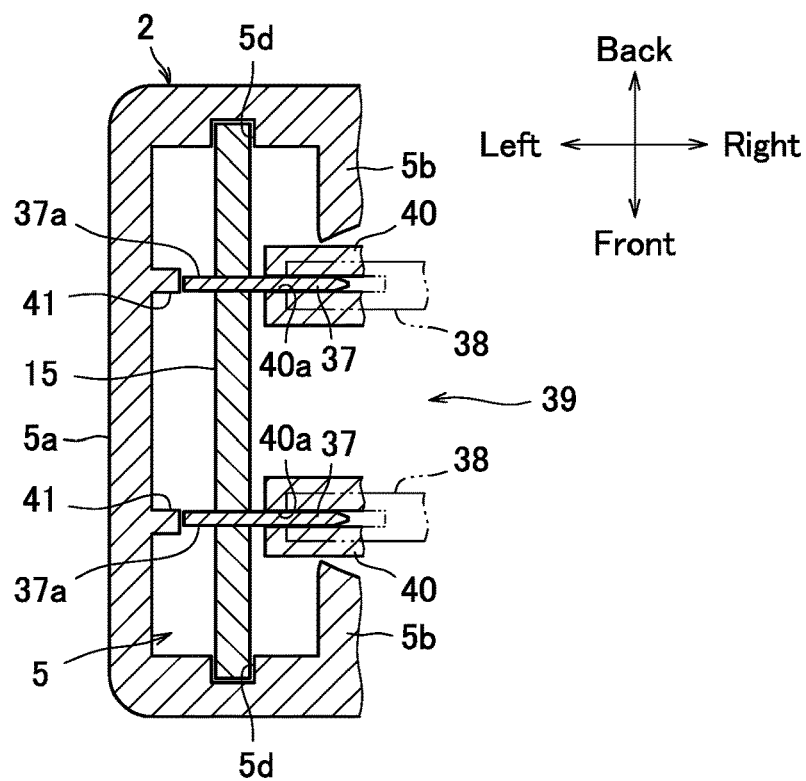
FIG. 11 is a cross-sectional view taken along the line XI-XI of FIG. 10, which illustrates the state in which the motor-side terminals are fitted to the board-side terminals.

FIG. 8 is a perspective view of an upper portion of the board housing 5 before the control board 15 is inserted. FIG. 9 is a perspective view of the upper portion of the board housing 5 after the control board 15 is inserted. FIG. 10 is a perspective view of the upper portion of the board housing 5 which illustrates a state in which motor-side terminals are fitted into the board-side terminals 37. FIG. 11 is a cross-sectional view taken along the line XI-XI of FIG. 10, which illustrates the state in which the motor-side terminals are fitted into the board-side terminals 37.

As illustrated in FIGS. 10 and 11 in particular, a pair of front and back motor-side terminals 38 is fitted into the corresponding board-side terminals 37 of the control board 15 in the board housing 5. With this configuration, the control board 15 and the motor 9 are electrically connected. This connection portion will be referred to as "terminal connection portion 39", and details thereof will be described below.

As illustrated in FIG. 8, an opening 4a of the worm housing 4, which opens toward the right side, is positioned in the upper portion of the board housing 5, and the opening 4a and the board housing 5 communicate with each other. In a state in which the motor 9 is fastened to the right side surface of the main body casing 2, as illustrated in FIG. 10, the output shaft 9a thereof is inserted into the worm housing 4 through the opening 4a via the upper portion of the board housing 5. Note that the rotation angle sensor 42 for detecting a motor rotation angle is provided on the output shaft 9a.

As illustrated in FIG. 8, a support wall 5c is horizontally extended from an upper end of the right wall 5b of the board housing 5 toward the left side, and a pair of front and back groove protrusions 40 having respective terminal guide grooves 40a (terminal guide portions) is formed at a left end of the support wall 5c. The terminal guide grooves 40a have a shape that is open toward the left side and in the up-and-down direction, and positions in the front-and-back direction of the terminal guide grooves 40a correspond to positions in the front-and-back direction of the above-mentioned board-side terminals 37. Therefore, as illustrated in FIG. 9, in a state in which the control board 15 is arranged in the board housing 5, the board-side terminals 37 are inserted into the corresponding terminal guide grooves 40a.

Meanwhile, a pair of front and back terminal position regulating portions 41 protrudes from the upper portion of the left wall 5a in the board housing 5 so as to extend in the up-and-down direction. Positions in the front-and-back direction of the terminal position regulating portions 41 correspond to the above-mentioned positions in the front-and-back direction of the board-side terminals 37, and right side surfaces of the terminal position regulating portions 41 correspond to tips of the press-fit terminals 37a of the board-side terminals 37 in the left-and-right direction. Therefore, as illustrated in FIG. 9, in a state in which the control board 15 is inserted into the board housing 5, the tips of the press-fit terminals 37a of the board-side terminals 37 abut against the corresponding terminal position regulating portions 41 from the right side or face the corresponding terminal position regulating portions 41 with a small gap.

As illustrated in FIGS. 10 and 11, the above-mentioned pair of motor-side terminals 38 protrudes from the motor 9 toward the left side. Positions in the front-and-back direction of the motor-side terminals 38 correspond to the above-mentioned positions in the front-and-back direction of the board-side terminals 37, and positions in the up-and-down direction of the motor-side terminals 38 correspond to positions in the up-and-down direction of the board-side terminals 37. A tip of each of the motor-side terminals 38 bifurcates in the front-and-back direction and is fitted into the corresponding board-side terminal 37, so as to sandwich the board-side terminal 37, thereby electrically connecting the control board 15 and the motor 9. Further, movement of the upper portion of the control board 15 is regulated in the board housing 5 by support from the motor 9 side via the motor-side terminals 38.

[Effects Obtained by Peripheral Configuration of Upper Portion of Control Board 15]

Next, there will be described effects obtained by the peripheral configuration of the upper portion of the control board 15 configured as described above.

First, as illustrated in FIG. 2, because the control board 15 is inclined, the position of the upper end of the control board 15 is displaced toward the left side from the upright posture orthogonal to the axis Cm of the output shaft 9a of the motor 9. Therefore, the upper end of the control board 15 is positioned in the dead space E illustrated in FIG. 2 formed among the wheel housing 3, the worm housing 4, and the board housing 5. As a result, the upper end of the control board 15 is separated from the two lower motor fastening portions 13 toward the left side in the direction of the axis Cm of the output shaft 9a.

Because the overlap between the control board 15 and the motor fastening portions 13 is avoided as described above, it is unnecessary to form relief portions in the control board 15 in order to prevent interference with the motor fastening portions 13. Therefore, it is possible to solve restriction regarding the board shape and achieve the control board 15 having an appropriate board shape, i.e., a general rectangular shape. Accordingly, it is possible to manufacture the control board 15 at an inexpensive cost and is therefore possible to achieve cost reduction of the power window unit 1. Further, it is possible to secure the maximum area of the board and achieve optimal arrangement of the elements on the control board 15. This makes it possible to prevent troubles and improve reliability.

Further, the terminal connection portion 39 is positioned at the upper portion of the control board 15 and is formed by fitting the motor-side terminals 38 into the board-side terminals 37. Because the motor-side terminals 38 protrude from the motor 9, the motor 9 is inevitably positioned close to the terminal connection portion 39 on the right side of the terminal connection portion 39. Further, the position of the terminal connection portion 39 is displaced toward the left side together with the position of the upper portion of the inclined control board 15, and thus the position of the motor 9 is also displaced toward the left side in accordance with the displacement. Note that the positions of the motor fastening portions 13 are also inevitably displaced toward the left side, but existence of the control board 15 whose position is similarly displaced toward the left side is not a factor that inhibits displacement of the positions of the motor fastening portions 13.

As described above, unlike the technology disclosed in Patent Literature 1, this embodiment does not need to displace the positions of the motor fastening portions toward the right side (in a direction away from the main body casing) in order to avoid the overlap between the control board and the motor fastening portions. On the contrary, the positions of the motor fastening portions 13 and the motor 9 are displaced toward the left side. Therefore, it is possible to reduce a horizontal length Lrl (illustrated in FIG. 2) of the power window unit 1.

Meanwhile, at the time of assembly of the power window unit 1, the board-side terminals 37 and the motor-side terminals 38 of the terminal connection portion 39 are connected in the following process.

When the control board 15 is inserted into the board housing 5 through the opening 18 of the board housing 5, the board-side terminals 37 gradually rise in accordance with the insertion and are inserted into the corresponding terminal guide groove 40a from below immediately before the insertion is completed. Although the positions of the small board-side terminals 37 having low rigidity tend to be shifted in the front-and-back direction due to inclination or the like, the board-side terminals 37 are corrected to be provided at proper positions in the front-and-back direction because the board-side terminals 37 are inserted into the terminal guide grooves 40a. Then, at the time when the insertion of the control board 15 is completed, the board-side terminals 37 are maintained at the proper positions in the front-and-back direction in the respective terminal guide grooves 40a, as illustrated in FIG. 9.

Further, the press-fit terminals 37a of the board-side terminals 37 gradually rise in accordance with the insertion of the control board 15, and, at the time when the insertion is completed as illustrated in FIG. 9, the tips of the press-fit terminals 37a abut against the terminal position regulating portions 41 from the right side or face the terminal position regulating portions 41 with a small gap.

Then, when the output shaft 9a of the motor 9 is inserted into the worm housing 4 of the main body casing 2 from the right side, the motor-side terminals 38 are brought close to the board-side terminals 37 from the right side in the board housing 5 in accordance with the insertion. At the time when the flange portion 9b of the motor 9 abuts against the right side surface of the main body casing 2, the motor-side terminals 38 are fitted into the corresponding board-side terminals 37 so as to sandwich the board-side terminals 37 from the right side. Because the board-side terminals 37 are maintained at the proper positions in the front-and-back direction in the terminal guide grooves 40a as described above, the motor-side terminals 38 are securely fitted into the board-side terminals 37.

When the board-side terminals 37 are fitted, the board-side terminals 37 receive pressing force toward the left side from the motor-side terminals 38. Therefore, even if the board-side terminals 37 are at the proper positions in the front-and-back direction, the board-side terminals 37 may be moved toward the left side or may be deformed due to the pressing force and may therefore be poorly fitted.

In this embodiment, however, the terminal position regulating portions 41 abut against the tips of the press-fit terminals 37a of the board-side terminals 37 from the left side and regulate the positions of the board-side terminals 37. Therefore, movement of the board-side terminals 37 toward the left side and deformation thereof are prevented. Thus, the board-side terminals 37 and the motor-side terminals 38 are further securely fitted into each other.

Further, the pressing force from the motor-side terminals 38 is transmitted to the terminal position regulating portions 41 via the board-side terminals 37 and does not affect the control board 15. Therefore, the control board 15 is not damaged. As a result, it is possible to securely establish electrical connection between the control board 15 and the motor 9 and prevent troubles such as contact failure in advance. This makes it possible to further improve reliability.

[Effects Regarding Posture of Control Board 15]

Next, there will be described effects obtained by the posture of the inclined control board 15.

Various countermeasures have been conventionally taken to reduce the size of the power window unit 1, and, also in this embodiment, a diameter of the worm wheel 8 is reduced (as a result, a diameter of the wheel housing 3 is also reduced) in order to reduce a vertical length of the worm wheel 8. However, it is difficult to reduce a vertical length of the control board 15 because the elements are arranged thereon. Therefore, if the control board 15 is arranged in the upright posture, the lower portion of the control board 15 protrudes below the attaching bracket 6. As a result, even if the diameter of the wheel housing 3 is reduced, a projected area seen from the right side is not reduced, and thus size reduction cannot be achieved.

As described above, in this embodiment, the control board 15 is inclined from the upright posture so that the position of the upper end is displaced toward the left side and the position of the lower end is displaced toward the right side. Therefore, the lower portion of the control board 15 is positioned above the attaching bracket 6 while the vertical length of the control board 15 is being maintained, and thus it is possible to prevent the lower portion from protruding toward the lower side. Accordingly, it is possible to reduce a vertical length Lud (illustrated in FIG. 2) of the power window unit 1. Further, depending on conditions, it is also possible to extend the control board 15 in the up-and-down direction so as to have a sufficient space to arrange the elements while preventing the control board 15 from protruding toward the lower side.

Both the horizontal length Lrl and the vertical length Lud of the power window unit 1 in this embodiment are reduced as described above. In addition to this size reduction, the power window unit 1 can maintain a substantially rectangular shape as a whole, which is advantageous in packing.

That is, as a result of the displacement of the position of the lower end of the control board 15 toward the right side, the board housing 5 and the connector cover 20 protrude toward the right side, as compared to a case where the control board 15 is in the upright posture. However, the right side corresponds to a space immediately below the motor 9, and thus the power window unit 1 maintains a substantially rectangular shape (Lrl in length×Lud in width) in front view. The power window unit 1 of a substantially rectangular shape is favorably packed in the case of mass transportation, and a loading amount per pallet can be increased. Therefore, the power window unit 1 is advantageous not only in performance but also in the following completely different point: being convenient at the time of transportation.

Incidentally, in this embodiment, the pair of front and back terminal position regulating portions 41 protrudes from the left wall 5a in the board housing 5, thereby preventing the board-side terminals 37 from being moved or deformed due to fitting into the motor-side terminals 38. However, a similar effect can be obtained with another configuration. Hereinafter, the another configuration will be described as another example of this embodiment.

Figure 12:
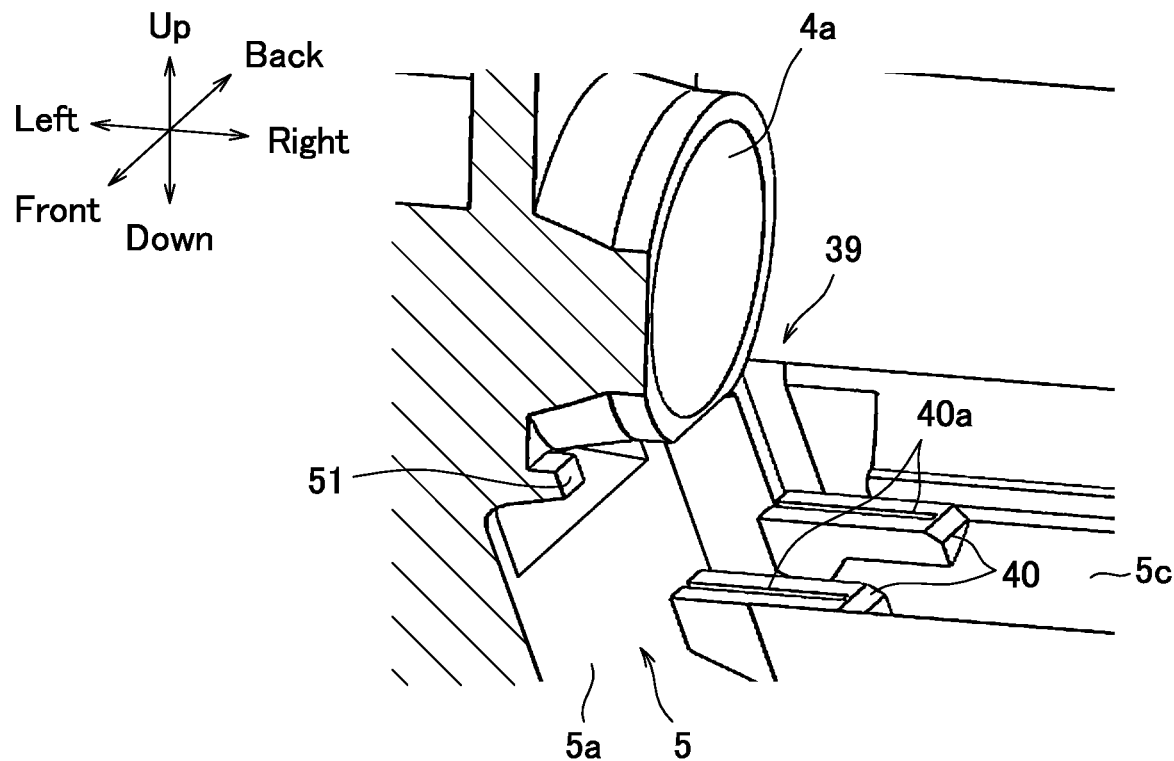
FIG. 12 is a perspective view of an upper portion of a board housing before a control board is inserted in another example.
Figure 13:
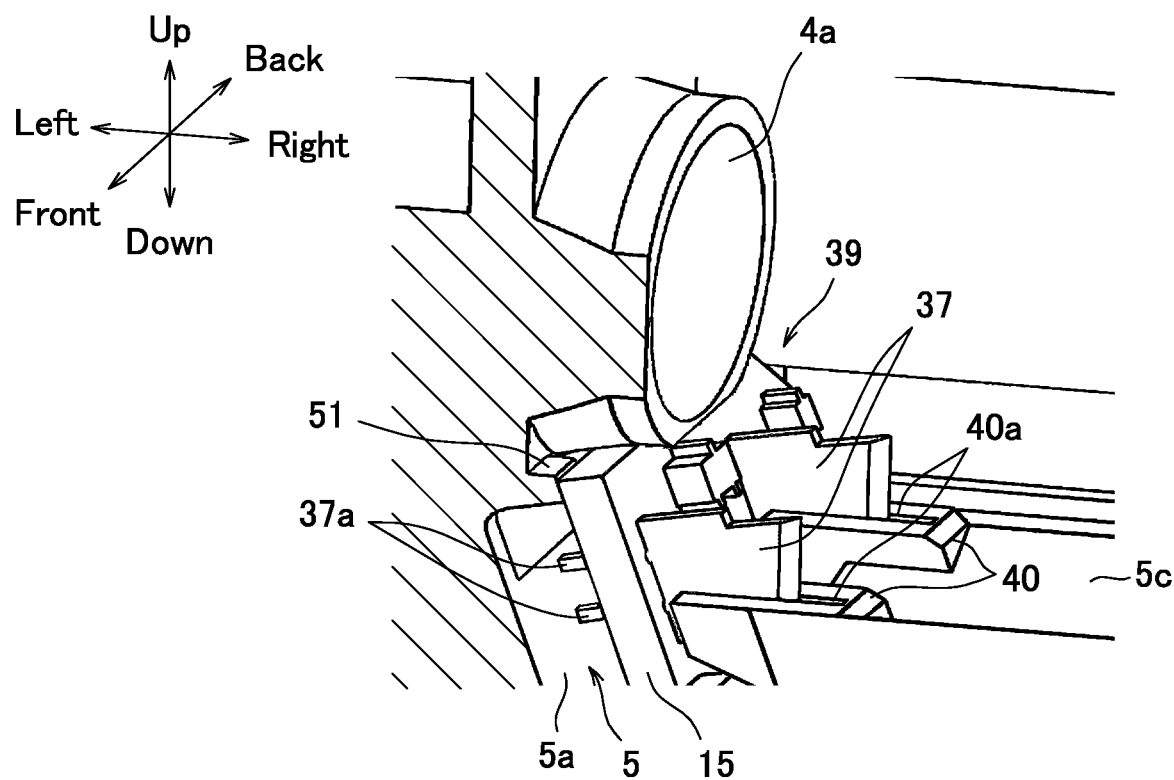
FIG. 13 is a perspective view of the upper portion of the board housing after the control board is inserted in the another example.
Figure 14:
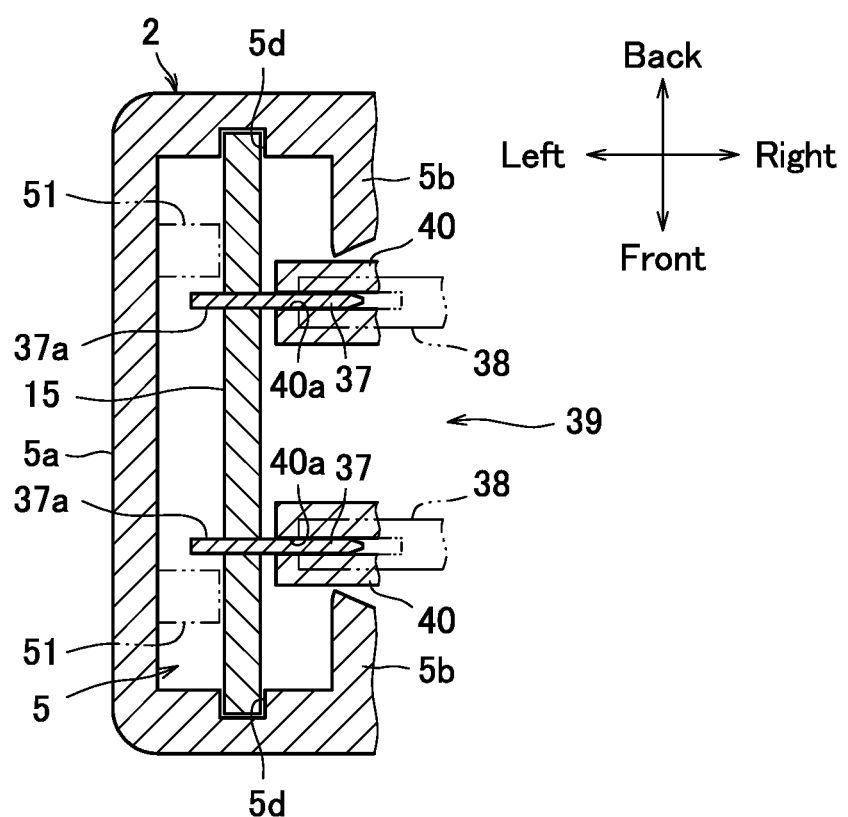
FIG. 14 is a cross-sectional view corresponding to FIG. 11, which illustrates a state in which motor-side terminals are fitted into board-side terminals in the another example.

FIG. 12 is a perspective view of the upper portion of the board housing 5 before the control board 15 is inserted in another example. FIG. 13 is a perspective view of the upper portion of the board housing 5 after the control board 15 is inserted. FIG. 14 is a cross-sectional view corresponding to FIG. 11, which illustrates a state in which motor-side terminals 38 are fitted into the board-side terminals 37.

As illustrated in FIGS. 12 to 14, a pair of front and back board position regulating portions 51 (only one board position regulating portion is illustrated in FIGS. 13 and 14) protrudes from the upper portion of the left wall 5a in the board housing 5, instead of the terminal position regulating portions 41. When the control board 15 is inserted into the board housing 5, as illustrated in FIGS. 13 and 14, the upper portion of the control board 15 abuts against right side surfaces of the board position regulating portions 51 from the right side or faces the right side surfaces with a small gap.

Then, when the motor-side terminals 38 are fitted into the board-side terminals 37 of the control board 15 from the right side, the board-side terminals 37 receive pressing force toward the left side. At this time, the board position regulating portions 51 abut against the upper portion of the control board 15 from the left side and regulate the position of the control board 15, thereby preventing a warp or deformation of the control board 15 caused by the pressing force. As a result, the positions of the board-side terminals 37 are also regulated via the control board 15, and therefore the board-side terminals 37 are prevented from moving toward the left side or being deformed. Thus, as in the above embodiment, it is possible to further securely fit the board-side terminals 37 and the motor-side terminals 38 into each other and prevent troubles such as contact failure in advance.

Description of the embodiment is finished herein, but an aspect of the present disclosure is not limited to this embodiment. For example, in the above embodiment, the present disclosure is embodied as the power window unit 1 that raises and lowers a window. However, the type of the motor unit is not limited thereto and can be arbitrarily changed. For example, the present disclosure may be applied to a motor for opening and closing a sunroof.

DESCRIPTION OF REFERENCE SIGNS

1 Power window unit
2 Main body casing
3 Wheel housing
5 Board housing
7 Front cover (cover member)
8 Worm wheel
9 Motor
9a Output shaft
10 Worm
12 Screw (fastening member)
13 Motor fastening portion
Control board
18 Opening
19 Connector terminal
20 Connector cover
21 Connector
22 Waterproof packing
27 Lower locking claw (locking portion)
37 Board-side terminal
38 Motor-side terminal
40a Terminal guide groove (terminal guide portion)
41 Terminal position regulating portion
51 Board position regulating portion

The invention claimed is:

1. A motor unit equipped with a decelerator, the motor unit comprising:
a worm wheel provided in a wheel housing of a main body casing and rotatably supported around an axis;
a motor inserted into and fastened to the main body casing with a fastening member from one side orthogonal to the axis of the worm wheel and in which a worm fixed to an output shaft meshes with the worm wheel;
a board housing defined by the main body casing so as to be adjacent to the wheel housing on the one side of the wheel housing; and
a control board inserted and provided in the board housing in a posture of crossing an axis of the output shaft of the motor, electrically connected to the motor, and including, on the one side, a connector to be connected outside, wherein:
the control board is inclined from a posture orthogonal to the axis of the output shaft of the motor toward a direction in which a position of an end portion on a motor side is displaced toward a side opposite to the one side, so that the end portion on the motor side is apart from a fastening portion including the fastening member in a direction of the axis of the output shaft;
the board housing has an opening on a side opposite the motor, a connector cover included in the connector is detachably provided on the board housing so as to close the opening, and the control board is inserted into the board housing from the side opposite the motor through the opening along a plate surface;
the control board includes a board-side terminal in a portion on the motor side of the control board and is electrically connected to the motor by fitting a motor-side terminal of the motor inserted to the main body casing into the board-side terminal from the one side after inserting the control board to the board housing; and
the board housing includes a terminal guide portion that corrects the position of the board-side terminal of the control board inserted from the side opposite the motor through the opening before inserting the motor to the main body casing.

2. The motor unit according to claim 1, wherein
a waterproof packing is interposed between the opening of the board housing and the connector cover.

3. The motor unit according to claim 1, wherein
the opening of the board housing is open in an oblique direction toward the side opposite the motor and the one side,
a connector terminal included in the connector together with the connector cover protrudes from the control board toward the one side through the opening, and
the connector cover includes the connector terminal is provided in the opening of the board housing from the one side so as to close the opening.

4. The motor unit according to claim 1, wherein
the control board includes a board-side terminal in a portion on the motor side of the control board and is electrically connected to the motor by fitting a motor-side terminal of the motor fastened to the main body casing into the board-side terminal from the one side, and
because of the inclination of the control board, a position of the board-side terminal and the position of the end portion on the motor side of the control board are displaced toward the side opposite to the one side.

5. The motor unit according to claim 1, wherein
the control board includes a board-side terminal in a portion on the motor side of the control board and is electrically connected to the motor by fitting a motor-side terminal of the motor fastened to the main body casing into the board-side terminal from the one side, and
the board housing includes a board position regulating portion that, when the motor-side terminal is fitted into the board-side terminal, abuts against the control board from the side opposite to the one side in the vicinity of the board-side terminal and regulates a position of the control board.

6. The motor unit according to claim 1, wherein
the control board includes a board-side terminal in a portion on the motor side of the control board and is electrically connected to the motor by fitting a motor-side terminal of the motor fastened to the main body casing into the board-side terminal from the one side, and
the board housing includes a terminal position regulating portion that, when the motor-side terminal is fitted into the board-side terminal, abuts against the board-side terminal from the side opposite to the one side and regulates a position of the board-side terminal.

7. The motor unit according to claim 1, wherein
because of the inclination of the control board, a portion on the side opposite the motor of the board housing is separated from the wheel housing toward the one side, and, in a space secured by the separation, a locking portion that allows one side of the connector cover to be detachable is provided.

8. The motor unit according to claim 1, wherein
the wheel housing is defined in such a manner that one side surface along the axis of the worm wheel is closed by a cover member, and
because of the inclination of the control board, a portion on the side opposite the motor of the board housing is separated from the wheel housing toward the one side, and, in a space secured by the separation, a circumference of the cover member is joined with a circumference of the wheel housing by a crimping process.

* * * * *